(12) United States Patent
Baumann et al.

(10) Patent No.: US 10,103,320 B2
(45) Date of Patent: Oct. 16, 2018

(54) COMPONENT WITH REDUCED STRESS FORCES IN THE SUBSTRATE

(71) Applicant: Micronas GmbH, Freiburg (DE)

(72) Inventors: Marc Baumann, Freiburg (DE); Thilo Rubehn, Gundelfingen (DE); Christian Joos, Ehrenkirchen (DE); Jochen Stephan, Freiburg (DE)

(73) Assignee: TDK-Micronas GmbH, Freiburg (DE)

( * ) Notice: Subject to any disclaimer, the term of this patent is extended or adjusted under 35 U.S.C. 154(b) by 23 days.

(21) Appl. No.: 15/146,498

(22) Filed: May 4, 2016

(65) Prior Publication Data

US 2017/0324028 A1  Nov. 9, 2017

(51) Int. Cl.
*H01L 29/82* (2006.01)
*H01L 43/06* (2006.01)
*H01L 43/04* (2006.01)
*H01L 43/14* (2006.01)

(52) U.S. Cl.
CPC ............ *H01L 43/065* (2013.01); *H01L 43/04* (2013.01); *H01L 43/14* (2013.01)

(58) Field of Classification Search
CPC ........ H01L 43/065; H01L 43/04; H01L 43/14
USPC .................................................. 257/76, 421
See application file for complete search history.

(56) References Cited

U.S. PATENT DOCUMENTS

| | | | |
|---|---|---|---|
| 5,291,607 A | 3/1994 | Ristic | |
| 5,600,074 A | 2/1997 | Morek et al. | |
| 7,980,138 B2 | 7/2011 | Ausserlechner | |
| 8,981,504 B2 * | 3/2015 | Motz | G01R 33/07 257/414 |
| 2005/0280107 A1 * | 12/2005 | Cohen | G01R 33/07 257/421 |
| 2007/0267709 A1 | 11/2007 | Oohira | |
| 2007/0290682 A1 | 12/2007 | Oohira | |
| 2010/0252900 A1 * | 10/2010 | Minixhofer | G01R 33/07 257/421 |
| 2012/0169329 A1 * | 7/2012 | Hellwig | G01R 33/07 324/251 |
| 2012/0241887 A1 * | 9/2012 | Schott | G01R 33/077 257/427 |
| 2013/0075724 A1 * | 3/2013 | Hirler | H01L 27/22 257/48 |

(Continued)

FOREIGN PATENT DOCUMENTS

| | | |
|---|---|---|
| DE | 10 2005 014157 | 10/2005 |
| DE | 10 2011 002580 A1 | 7/2012 |
| JP | H09-97 895 A | 8/1997 |
| JP | 2004-235 328 | 8/2004 |

OTHER PUBLICATIONS

Ralph Steiner Vanha, Publisher Physical Electronics Laboratory, Swiss Federal In-stitute of Technology (ETH) Zurich, 1999, pp. 39-53.

(Continued)

*Primary Examiner* — Caleb Henry
(74) *Attorney, Agent, or Firm* — 24IP Law Group; Timothy R DeWitt

(57) ABSTRACT

A component with a magnetic field sensor. The electronic component is located in a semiconductor substrate or on the surface of the semiconductor substrate and is surrounded at least partially, preferably largely, by a trench in the semiconductor substrate. The trench is filled with a filling material.

16 Claims, 3 Drawing Sheets

(56) References Cited

U.S. PATENT DOCUMENTS

| | | | | |
|---|---|---|---|---|
| 2013/0307609 A1* | 11/2013 | Ausserlechner | ........ | G01R 33/07 327/511 |
| 2013/0342196 A1* | 12/2013 | Ausserlechner | ........ | G01R 33/07 324/251 |
| 2014/0239768 A1* | 8/2014 | Johnson | ................ | B06B 1/0292 310/300 |
| 2014/0266182 A1* | 9/2014 | Rocznik | ................ | H01L 43/04 324/251 |
| 2015/0102807 A1* | 4/2015 | Eckinger | ............ | G01R 33/072 324/251 |
| 2015/0255709 A1* | 9/2015 | Hebert | ................ | G01R 33/072 257/427 |
| 2015/0357561 A1* | 12/2015 | Toh | ........................ | H01L 43/14 257/421 |
| 2015/0369881 A1* | 12/2015 | Ausserlechner | ........ | G01R 33/07 324/251 |
| 2016/0018478 A1* | 1/2016 | Hebert | ................ | G01R 33/077 257/421 |
| 2016/0111631 A1* | 4/2016 | Schott | .................. | H01L 43/065 257/421 |
| 2016/0268498 A1* | 9/2016 | Eckinger | ................ | H01L 43/04 |
| 2017/0125479 A1* | 5/2017 | Green | .................... | H01L 27/22 |

OTHER PUBLICATIONS

"Compensation of the Piezo-Hall-Effect in Integrated Hall Sensors on (100)-Si", Udo Ausserlechner et al., IEEE Sensors Journal vol. 7, No. 11, Nov. 2007, 1475-1482.

* cited by examiner

COMPONENT WITH REDUCED STRESS FORCES IN THE SUBSTRATE

CROSS-REFERENCE TO RELATED APPLICATIONS

None.

BACKGROUND OF THE INVENTION

Field of the Invention

The invention relates to a magnetic field sensor, wherein the magnetic field sensor is surrounded partially by a trench in a semiconductor substrate.

Brief Description of the Related Art

FIG. 3 shows a cross section of a possible embodiment of a lateral Hall sensor 300 which is implemented in CMOS technology on a silicon substrate 310 and which has a sensitivity to a vertical component of a magnetic field (along the z-axis). The functional layers of the Hall sensor 300 are located below a surface 315 of the silicon substrate 310 in corresponding regions 320, 330 of the semiconductor substrate 310. The functional layers are limited by means of doping. The first layer 320 in this embodiment is an n-type layer and the second layer 330 lying on top is a p-type layer. The contact to the Hall sensor 300 and to other components in the silicon substrate 310 is effected in a further layer structure on the substrate by means of metal conductor paths 340 and 350. From FIG. 3 it can be seen that the metal conductor paths 340 and 350 contact the doping regions via corresponding contact diffusions 345 and 355.

The Hall sensor 300 can also be formed as an array with a plurality of interconnected Hall elements. Depending on the embodiment, the array can include lateral and vertical Hall elements which, are sensitive to the vertical and/or horizontal components of the magnetic field.

Other magnetic field sensors such as TMR, AMR, etc. can usually be attached on the surface 315 of the semiconductor substrate 310. The teaching of this document encompasses also magnetic field sensors and other electronic components that have an integrated component on the surface of a semiconductor substrate and in which the integrated component extends or can extend into the semiconductor substrate 310 (such as those implemented using CMOS technology).

It is known that the piezoresistive and piezo-Hall effect impairs the performance of Hall sensors. The complex mechanical stress conditions that are caused during the packaging process or otherwise in the semiconductor substrate 310 to or in which a Hall sensor 300 is attached can only be insufficiently determined. Their influence on the Hall elements can be compensated only conditionally and with considerable effort. Further, the induced mechanical stress in the Hall element shows a strong dependence on environmental conditions such as, for example, temperature and relative humidity. Slow changes in the mechanical stress over the lifetime of the Hall sensor 300 and the other components caused by plastic deformations (in the composite body) can likewise be detected only insufficiently and can be only used to a limited extent for a compensation of these influences on the properties of the Hall sensor 300.

Various methods are known in the art, which compensate for the influences on the sensor element of mechanical stress conditions in the semiconductor substrate. For example, for offset reduction, the so-called "current spinning" method is used, also known as "current switching" method.

The spinning current method is known, in connection with lateral Hall sensors 300 for suppressing the offset of the sensor signal, from the book "Rotary Switch and Current Monitor by Hall-Based Microsystems" by Ralph Steiner Vanha, Publisher Physical Electronics Laboratory, Swiss Federal Institute of Technology (ETH) Zurich, 1999, pages 39-53. The spinning current method consists in continually, cyclically rotating further by, for example, 90° the measurement and current direction of the Hall sensor 300 at a certain clock frequency, forming a sum over all measuring signals using a full rotation by 360° and thereby reducing the influence of offset voltages.

The long-term drift of the magnetic sensitivity of the Hall sensors is discussed in the publication "Compensation of the Piezo-Hall-Effect in Integrated Hall Sensors on (100)-Si", Udo Ausserlechner et al., IEEE Sensors Journal vol. 7, no. 11, November 2007, 1475-1482. The authors found that this long-term drift is caused by changes in the mechanical stress formation in the semiconductor substrate by the packaging. In this publication, a system is disclosed which measures the stress components in the semiconductor substrate and thus estimates the sensitivity drift. A correction can be made in the ascertained measured values. The U.S. Pat. No. 7,980,138 also discloses this device. The patent protects a method for stress measurement on an IC by means of at least two interconnected piezoresistive resistors.

From U.S. Pat. No. 5,600,074 (Marek et al.) a silicon semiconductor substrate for use in a force sensor is known. This patent shows trenches arranged in parallel for the protection of electrical circuits from mechanical stress upon vertical loading of a semiconductor substrate.

The sensitivity drift of the Hall sensor 300, caused by changes in the mechanical stress conditions after adjustment of the Hall sensor 300 can be compensated with the system from the Ausserlechner publication. However, the mechanical stress sensors are themselves subject to an undesirable cross-dependence, such as, for example, from the temperature, which in turn must be also compensated. It is also known that the mechanical stress measurement in a semiconductor substrate is very complicated and requires chip space ("real estate"), which is no longer available for other components or which increases the current consumption and the production costs of the integrated circuit. An inaccuracy of the measured values also results from the fact that the mechanical stresses in the semiconductor substrate are measured in locations other than the mechanical stresses that act directly in the region of the Hall sensors. The additional stress measurements also require an increased effort of processing of the measuring signals, which in turn is related to a higher circuit complexity.

To address these disadvantages, the Japanese patent application no. JP H09-97895 and the Japanese patent application no. 2004-235328 describe a magnetic field sensor on or in a semiconductor substrate, wherein the magnetic field sensor is at least partially surrounded by a trench in a semiconductor substrate. Thus, the mechanical stress components in the semiconductor substrate are largely avoided in the region of the surface.

The manufacturing process described in these Japanese patent applications is such that this trench can be filled partially or completely during the subsequent packaging process of the magnetic field sensor, i.e. during the insert molding (encapsulation) of the components with the casting compound. This results in a rigid mechanical connection between the trench walls, through which mechanical stresses can be transferred from one side to the other. Therefore, the desired stress reduction is strongly reduced or completely canceled in the region of the sensor element. (Depending on the type of filler used, it is even possible to increase the mechanical stress state in the sensor region)

When the trench is filled only partially with the encapsulation material, cavities are formed which can be filled with water when the component is exposed to moisture. A sudden rise in temperature, such as that which occurs, for example, during the soldering of a packaged component, then leads to the bursting of the outer shell (popcorn effect) and thus to the destruction of the component.

Various other prior art documents are known. For example, German Patent Application No DE 10 2011 002 580 A1 shows a semiconductor substrate with a surface and magnetic field sensor with trenches that surround at least part of the magnetic field sensor. The trenches are filled with an oxide. The oxide is rigid and is not able to absorb stresses in the semiconductor substrate.

German Patent Application No DE 20 2005 014 157 and US Patent Application publication No. US 200/70290682 also disclose semiconductor substrates with trenches. Neither of these applications teaches that the trench is filled with a resilient material that it is able to absorb stresses in the substrate.

SUMMARY OF THE INVENTION

To address these and other disadvantages of the state of the art, the trench in the semiconductor substrate is filled with a suitable material, which is resilient and will be hereinafter referred to as buffer material. The filler can no longer intrude into the trench during insert molding. The buffer material is resilient and thus is able to absorb the stress, which arises in the composite body during manufacture and does not pass them through to the sensor.

Further, an additional layer of a buffer material can be applied to the semiconductor substrate to absorb mechanical stresses acting between the silicon or sensor surface (island) and the casting compound.

In a further exemplary embodiment, the trench and the sensor elements are covered with a cap to prevent the intrusion of the filler into the trench during the encapsulation process. The cap is adhesively bonded suitably on the silicon substrate, and typically can have a recess or cavity in the region of the trench and of the sensor element.

In one aspect both of the methods can be combined, i.e. the cap can also be adhesively bonded over a filled trench with/without buffer layer.

With the aid of this structure, it is no longer required to provide additional sensors for the measurement of the mechanical stress and a signal processing processor for the evaluation of the compensating effects. The silicon area (real estate) for these additional components is not utilized and the power consumption is reduced.

With regard to manufacturing technology, in one embodiment the trench is preferably produced by means of a laser removal. Alternatively, the removal can also be effected by means of a suitable physical dry etching process (reactive ion etching (RIE), deep reactive ion etching (Bosch process, DRIE), ion beam cutting), or by wet-chemical etching using KOH or EDP for example.

In one aspect, the magnetic field sensor is largely surrounded by the trench; thereby forming an island in the semiconductor substrate with the magnetic field sensor. A connection between a signal processing processor and the magnetic field sensor is provided on a connecting bridge between the island and the other part of the semiconductor substrate by conducting paths running on it or highly conductive diffusions in the silicon substrate.

In order to achieve a sufficient isolation of the mechanical stress, the trench has a depth amounting to, for example, at least one twentieth of the diagonal of the island on the surface or 5 µm. In a different aspect, the trench can penetrate fully through the silicon substrate. The width of the trench amounts to less than 100 µm, so that not too much silicon area is utilized. The trench is subsequently filled with a filling material (buffer material).

The magnetic field sensor can be a Hall sensor or other sensor which is sensitive to mechanical stresses. Moreover, together with the Hall sensor, the island can contain several further components which have a cross-sensitivity to mechanical stresses and are required for signal processing of the magnetic field sensor/sensors, such as, for example, analog to digital converters or voltage and current sources for supplying the sensor.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which.

DETAILED DESCRIPTION OF THE INVENTION

Figure 1A:
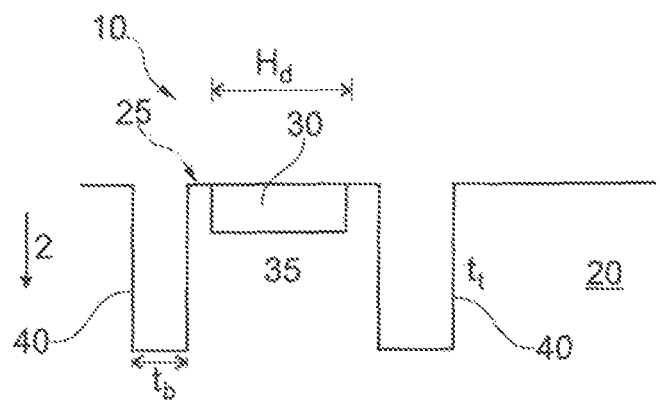
FIG. 1A shows a side view of the component

FIG. 1A shows a side view of a component 10 according to one aspect of this invention. A magnetic field sensor 30 is introduced or integrated into a semiconductor substrate 20 or arranged on a surface 25 of the semiconductor substrate 20.

Figure 1B:
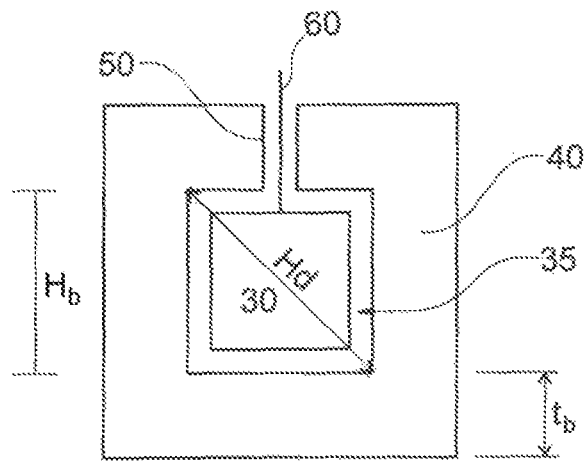
FIG. 1B shows a plan view of the component.

The magnetic field sensor 30 is surrounded at least partially by a trench 40. As can be seen in FIG. 1B, the trench 40 in this aspect of the disclosure surrounds the electronic component 30 largely, but not completely, forming a kind of "island" 35 in the semiconductor substrate 20.

A connecting bridge 50 passes between the island portion of the surface 25 and the other part of the semiconductor substrate 20. Metal conductor paths 60 extend via the connecting bridge 50 which connect the magnetic field sensor 30 on the island 35 with further metal conductor paths on the remaining part of the surface 25. A Hall sensor requires, for example, at least four lines 60 for the four connectors or electronic connections. The electrical connections can be implemented also by means of suitable diffusions on the connecting bridge instead of metal conductor paths.

The trench 40 has a depth $t_t$, which should be at least 5 μm, or one twentieth of the diagonal $H_d$ of the island 35 on the surface 25. The trench 40 can also penetrate the semiconductor substrate 20 fully. The trench 40 around the island 35 results in the magnetic field sensor 30 being largely isolated from stress forces in the semiconductor substrate 20. The magnetic field sensor 30 on the island 35 is thus not influenced by the stress forces in the semiconductor substrate 20.

Figures 2A, 2B:
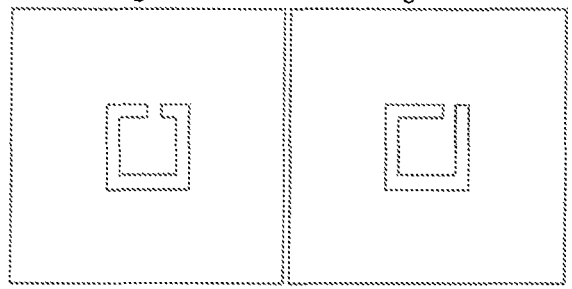
FIGS. 2A-2N show several construction components with differently arranged connecting bridges.
Figures 2C, 2D, 2E:
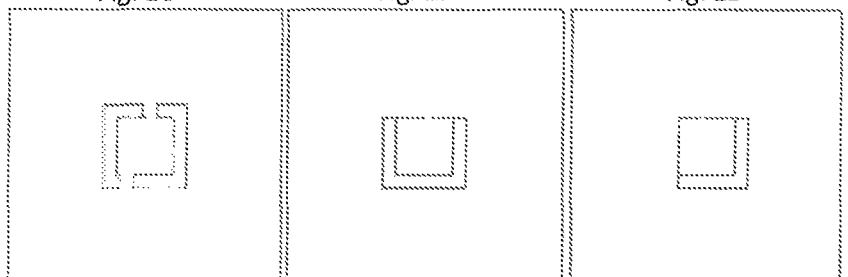
Figures 2F, 2G, 2H:
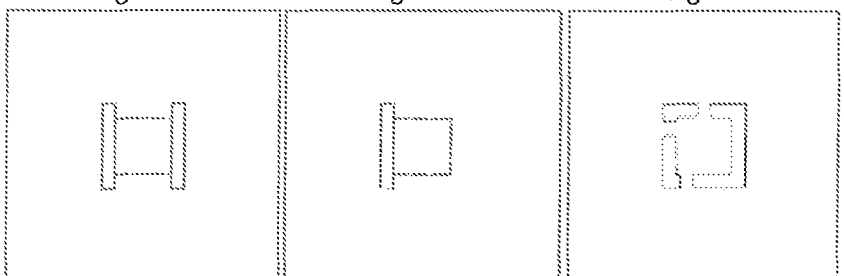
Figures 2I, 2J, 2K:
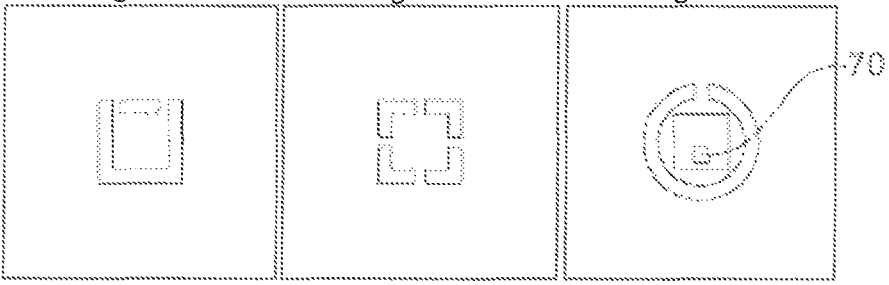
Figures 2L, 2M, 2N:
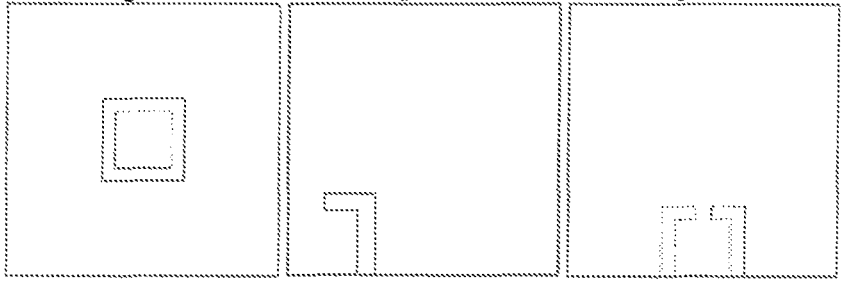
Figure 3:
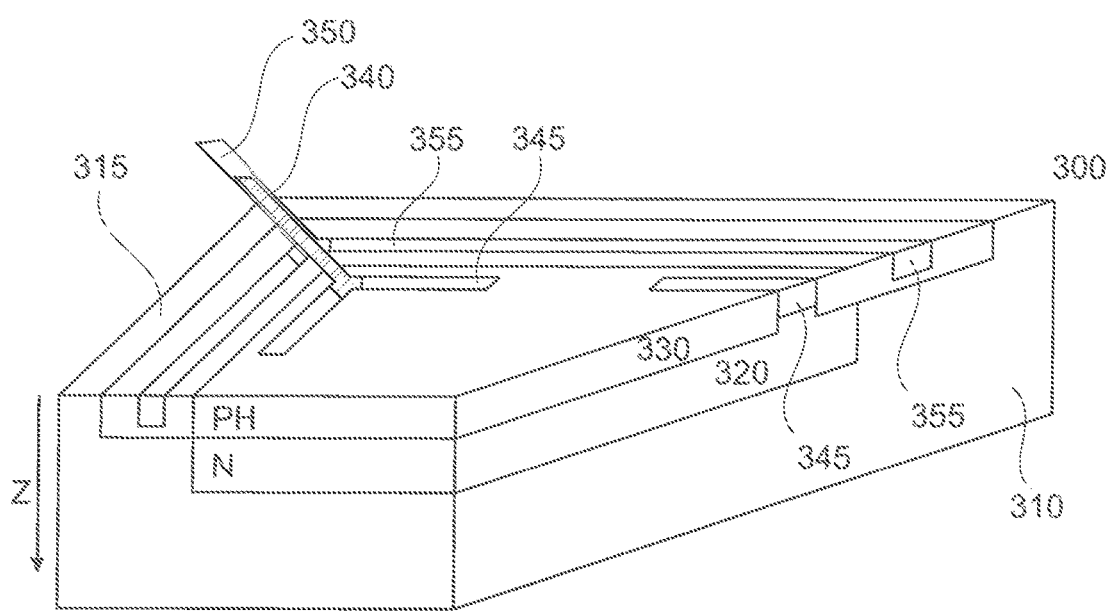
FIG. 3 shows a lateral Hall sensor according to the state of the art.

As can be seen from FIGS. 2A-2N, the connecting bridge 60 is not required to run centrally on one side of the island in the trench 40. The connecting bridge 50 can also be arranged on the side, as can be seen from FIG. 2B. Two connecting bridges 50 can be present likewise (see FIG. 2C). In some other embodiments, the trench 40 is not required to fully surround the island 35 to achieve the desired isolation of the stress forces or to prevent the spreading of the same. FIG. 2D-2G show aspects of the structure, for example, in which the trench 40 does not fully surround the island 35. Although the mechanical isolation in the aspects according to FIGS. 2D-2G is not as strong as in other aspects, the manufacture of such trenches 40 can be achieved more cost-effectively, and the island 35 is connected to the remaining semiconductor substrate 20 in a mechanically more robust fashion.

FIGS. 2H-2L show other embodiments of the trench 40, wherein in FIG. 2L the trench 40 is formed without a connecting bridge 50. The contacting of the electronic component can be established in this case by bonding connections for example. Furthermore, it is possible that the magnetic field sensor 30 can contain not only one single electronic component on its surface 25, but also have additional components 70. FIG. 2K shows a different form of the trench 40 with a further component 70. FIG. 2N shows a possible embodiment with an island 35 on the edge of the semiconductor substrate 20 and FIG. 2M shows a possible embodiment with an island in a corner of the semiconductor substrate 20.

FIG. 2I-2M show other embodiments of the trench 40, wherein in FIG. 2M the trench 40 is formed without a connecting bridge 50. The contacting of the electronic component can be established in this case by bonding connections for example. Furthermore, it is possible that the magnetic field sensor 30 can contain not only one single electronic component on its surface 25, but also have additional components 70. FIG. 2L shows a different form of the trench 40 with a further component 70. FIG. 2P shows a possible embodiment with an island 35 on the edge of the semiconductor substrate 20 and FIG. 2N shows a possible embodiment with an island in a corner of the semiconductor substrate 20.

The trench 40 is obtained by a conventional etching process, for example by laser removal or other physical or wet-chemical etching. As other etching processes dry etching processes (reactive ion etching—RIE, deep reactive ion etching—Bosch process, DRIE and ion beam cutting), or wet-chemical etching by means of KOH or EDP can be considered. The magnetic field sensor 30 and the other components are manufactured by conventional production steps.

Figure 1C:
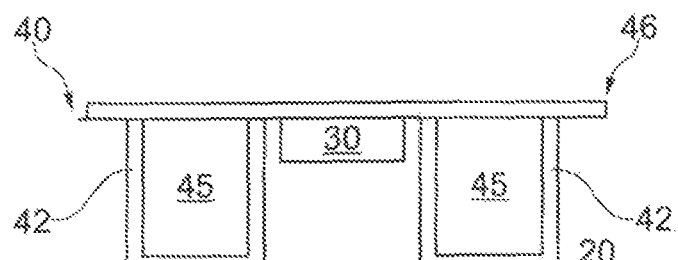
FIG. 1C shows the side view with filled trench.

The trench 40 in FIG. 1C is optionally lined partially on its inner surface (passivated) with one or several components for protection against environmental influences. As a lining layer 42, a nitride such as $Si_3N_4$ or a polyimide is preferably used. The trench 40 is completely filled, with or without lining, wherein the filling of the trench can also be effected with several layers of different buffer materials. The buffer material/the buffer materials 45 has/have typically a smaller elasticity and/or bulk modulus than the substrate. As the buffer material, preferably a polymer is used, for example an elastomer such as a silicon compound or other suitable material, which can absorb the mechanical stresses that occur in the filled trench. However, the buffer material can also be an epoxy resin. The filling of the trench 40 allows a further encapsulation of the component, wherein no, or only small mechanical stresses are transferred from the substrate to the island via the filling material 45.

A further buffer layer 46 can be applied to the surface 25 of the semiconductor substrate and the filled trench 40. This buffer layer absorbs the mechanical stresses acting from the sealing compound on the surface of the island. The buffer layer typically covers at least the island as well as the trench and thus covers the entire Si surface only partially. In one aspect, the buffer layer consists of the same material with which the trenches are filled. Alternatively, the buffer layer 46 from a plastic foil can be applied by adhesive bonding on the surface 25. (FIG. 1C shows a trench 40 with encapsulation layer 42 and buffer filling material 45 and buffer layer 46.)

Figure 1D:
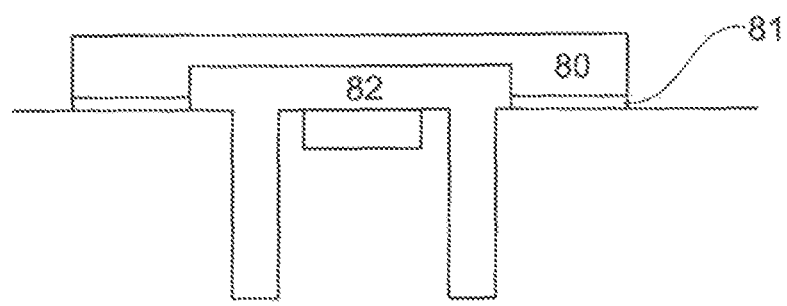
FIG. 1D shows the side view of a component with a lid.

FIG. 1D shows a component with a cap 80 which is attached over the island by means of an adhesive layer 81. The cap 80 encloses an air volume 82 in its cavity. The cap protects the trench against the intrusion of material during the encapsulation process and against the intrusion of moisture and the formation of water reservoirs in the trench. Alternatively, the cap 80 can also be applied to a component with a filled trench with/without buffer layer over the island surface. The cap 80 is typically manufactured of a non-magnetic material. When a non-magnetic and electroconductive material is used, such as copper, for example, the sensor element is additionally shielded from electromagnetic radiation.

Moreover, in addition to the magnetic field sensor 30, the component 10 can also have several magnetic field sensors and include circuitry components that have a cross-sensitivity to mechanical stresses and are required for the signal processing of the magnetic field sensor/sensors, such as, for example, analog to digital converter, or voltage and current sources for supplying the sensor.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:
1. A component comprising:
   a semiconductor substrate with a surface;
   a magnetic field sensor; and
   a trench filled with a filling material in the semiconductor substrate, said trench surrounding the magnetic field sensor at least partially, wherein the filling material is a buffer material for absorbing mechanical stresses; and
a cap covering the trench and the magnetic field sensor, wherein the cap encloses an air volume in a cavity between the trench and the magnetic field sensor.

2. The component according to claim 1, wherein the surface has a buffer layer.

3. The component according to claim 1, wherein the trench surrounds the magnetic field sensor largely, in order to form an island, and further has a connecting bridge.

4. The component according to claim 3, further comprising conductor paths, diffusions or bonding connections, which contact the electronic connections of the magnetic field sensor and are guided over the connecting bridge.

5. The component according to claim 1, wherein the magnetic field sensor is integrated in the semiconductor substrate.

6. The component according to claim 1, wherein the magnetic field sensor is a Hall sensor.

7. The component according to claim 1, wherein the trench has a depth which is at least 5 μm or one twentieth of the diagonal of the magnetic field sensor.

8. The component according to claim 1, wherein the trench penetrates the semiconductor substrate fully.

9. The component according to claim 1, wherein the width of the trench is less than 100 μm.

10. The component according to claim 1, wherein the filling material is a polymer or polyimide.

11. The component according to claim 1, wherein the surface of the trench has an encapsulation layer.

12. The component according to claim 11, wherein the encapsulation layer is a nitride.

13. The component according to claim 1, wherein the trench is produced by laser removal.

14. A construction element with a component comprising a semiconductor substrate with a surface; a magnetic field sensor; and a trench filled with a filling material in the semiconductor substrate, said trench surrounding the magnetic field sensor at least partially, comprising a further component that is surrounded at least partially by the trench, wherein the filling material is a buffer material for absorbing mechanical stresses, and wherein the trench and the magnetic field sensor are covered with a cap, wherein the cap encloses an air volume in a cavity between the trench and the magnetic field sensor.

15. The construction element according to claim 14, wherein the further component is a circuitry component for controlling the magnetic field sensor.

16. The construction element according to claim 14, wherein the further component is a circuitry component for capturing the data from the magnetic field sensor.

* * * * *